United States Patent [19]

Yu

[11] 4,083,063
[45] Apr. 4, 1978

[54] GATE TURNOFF THYRISTOR WITH A PILOT SCR

[75] Inventor: Rosendo U. Yu, Auburn, N.Y.

[73] Assignee: General Electric Company, Auburn, N.Y.

[21] Appl. No.: 404,494

[22] Filed: Oct. 9, 1973

[51] Int. Cl.² ............................................ H01L 29/74
[52] U.S. Cl. ........................................ 357/38; 357/86
[58] Field of Search ................... 317/235 AB; 357/38, 357/86

[56] References Cited

U.S. PATENT DOCUMENTS

| 3,401,320 | 9/1968 | Weinstein | 317/235 |
|---|---|---|---|
| 3,543,105 | 11/1970 | Suedberh et al. | 317/235 |
| 3,579,060 | 5/1971 | Davis | 317/235 R |
| 3,611,066 | 10/1971 | Knaus | 317/235 R |
| 3,694,670 | 9/1972 | Marzolf | 357/38 |
| 3,725,752 | 4/1973 | Garrett | 357/38 |
| 3,725,753 | 4/1973 | Garrett | 317/235 R |
| 3,771,029 | 11/1973 | Burtscher et al. | 317/235 R |

Primary Examiner—Stanley D. Miller, Jr.
Assistant Examiner—Joseph E. Clawson, Jr.
Attorney, Agent, or Firm—R. J. Mooney; S. B. Salai

[57] ABSTRACT

Disclosed is a thyristor comprising a primary semiconductor controlled rectifier and a pilot semiconductor controlled rectifier. Conduction in the primary controlled rectifier is initiated by conduction in the pilot rectifier, which in turn is initiated by receipt of a preselected signal on a gate terminal. An auxiliary current drain contact is coupled to the gate region of the primary controlled rectifier. When a predetermined current is withdrawn from the gate region of the primary controlled rectifier through the auxiliary current drain contact the device turns off as described below. The current drain apparatus can include, for example, a selective coupling system such as a diode coupled to the gate contact so that the gate contact can be employed to withdraw current from the primary controlled rectifier portion.

14 Claims, 5 Drawing Figures

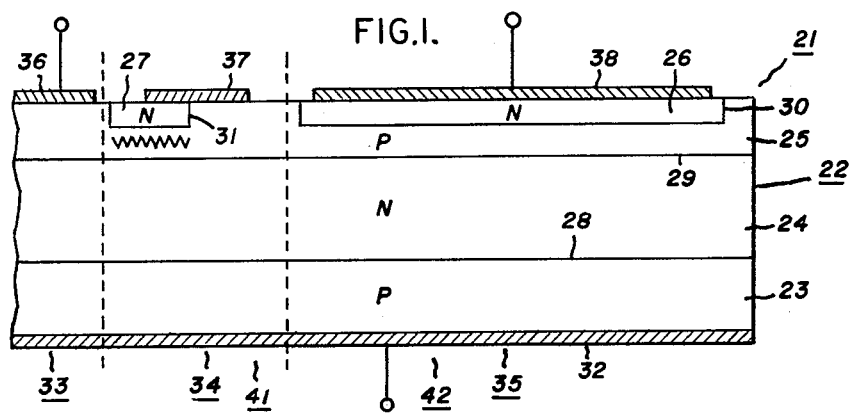
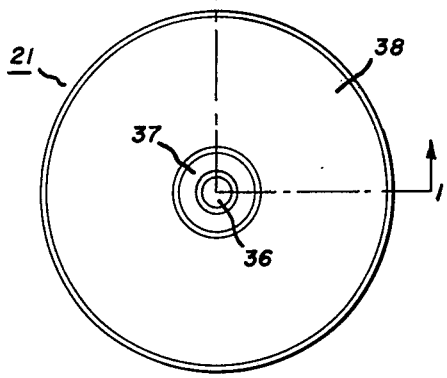
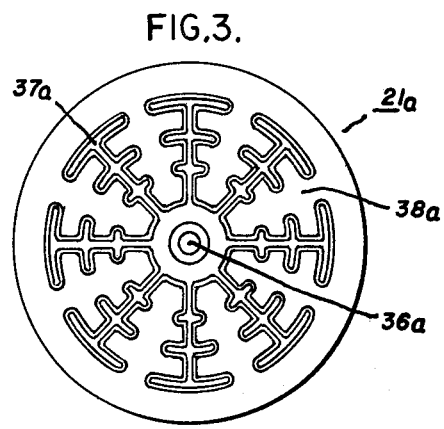
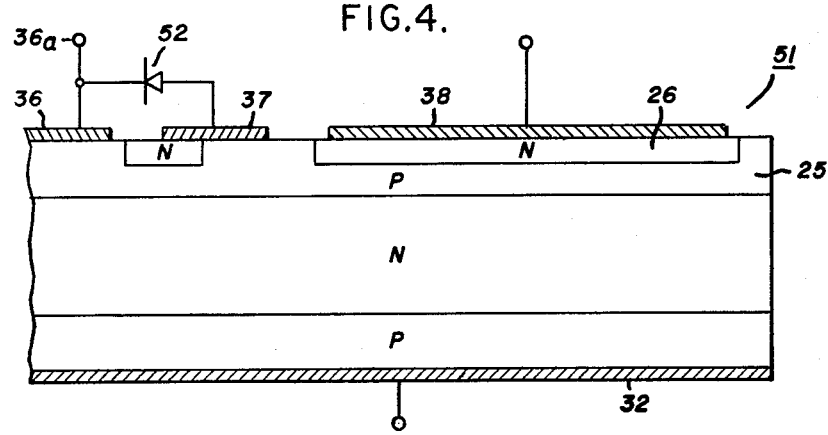
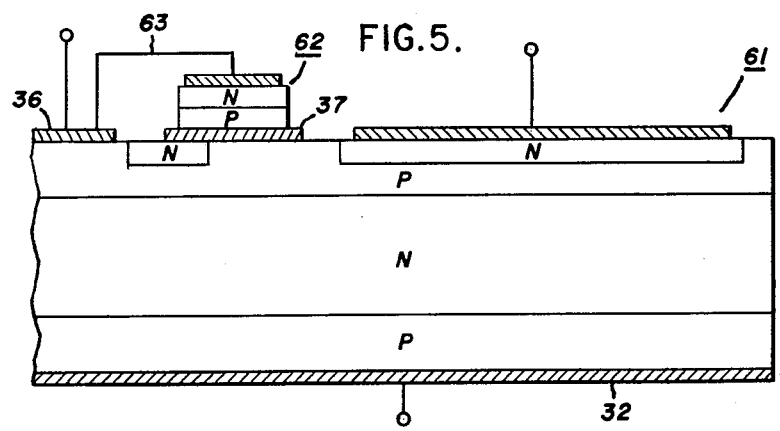

GATE TURNOFF THYRISTOR WITH A PILOT SCR

BACKGROUND OF THE INVENTION

This invention relates to thyristors and, more particularly, to high current carrying thyristors with pilot devices therein to facilitate rapid device turn on and having gate turnoff capability.

Semiconductor controlled rectifiers are becoming more popular. Circuit design engineers have been developing an ever increasing number of applications for them. Some applications are demanding and require unusual electrical characteristics in the controlled rectifiers to be employed. For example, some applications require extremely high current devices and other applications require devices with very fast response times. Certain applications require a combination of unusual characteristics in a given device. For example, high power applications often require high frequency characteristics also. However, when the structure of controlled rectifiers is altered to provide a given characteristic in the finished devices, other characteristics are sometimes adversely affected. For example, to provide a device with a high current carrying capability the conductive area is generally made larger. Unfortunately, an increase in the size of the current conducting area generally has an adverse effect on device response time. This is true for the following reason. A semiconductor controlled rectifier is typically a four layer device defining three PN junctions. One of the outer layers is a cathode emitter. In general, the conductive area of the controlled rectifier is coextensive with the area of the cathode emitter. However, turnon of the rectifier is possible only at the periphery of the emitter and, often, occurs only at a point or very few points along the periphery. A finite propagation time is required for the remainder of the potentially conductive area to be rendered conductive. In large devices this propogation time can be several hundred microseconds. It will be appreciated that such along turnon time prevents efficient utilization of large devices with high frequency, high power signals. Thus, when a conventional semiconductor controlled rectifier is utilized with high frequency high power devices, full power is sometimes applied more rapidly than full conduction can be achieved. In that event the current density in the area that is conducting can exceed the safe limit for the device in question and lead to device failure. The above is, of course, well known in the prior art. See, for example, the *SCR MANUAL*, Fifth Edition, copyright by the General Electric Company, 1972.

One solution to the problem of an unacceptably long propagation time has been the interdigitation approach. This is also discussed in the *SCR MANUAL*. When it is desired to utilize the interdigitation technique, the periphery of the cathode emitter, rather than being a regular shape such as a rectangle or a circle, is provided with a plurality of indentations so that all points of the emitter are relatively near the peripehery. Consequently, propagation time becomes less of a problem.

However, interdigitation has an effect on other device characteristics. For example, it has been found that in order to turn on the entire periphery of the cathode emitter a large triggering current is required. The current required is dependent upon the length of the periphery. It will be appreciated that an interdigitated device includes an extremely long emitter periphery and thus a very high triggering current is required to turn on the entire periphery. For example, in a controlled rectifier capable of conducting a current of 200 amperes, a triggering current in the range of 5 to 10 amperes may be necessary. This, of course, requires that low level triggering signals be substantially amplified in order to be usable. Thus, triggering circuits are rendered quite complex. Failure to simultaneously turn on the entire emitter periphery negates much of what was gained by utilizing an interdigitated structure. Thus, in summary, interdigitation provides a technique for rendering high current semiconductor controlled rectifiers amenable to high frequency operation. However, the resulting devices require substantial triggering currents to operate effectively.

In order to overcome the high triggering current requirements of high current SCRs, self-contained pilot units were incorporated in SCRs in a manner more fully described below. Briefly, a pilot SCR is a controlled rectifier coupled to the source of current to be controlled and the gate of the primary SCR. A small triggering current is sufficient to activate the pilot SCR which in turn supplies a substantial gate current to the primary SCR thus insuring that the entire periphery of the primary SCR emitter is rendered conductive. Thyristors including pilot SCRs have become popular, particularly in high power high current devices.

A characteristic of most semiconductor controlled rectifiers is that once rendered conductive they remain conductive until the current passing through them ceases at which time they become non-conductive and remain so until triggered again. Thus, no sustained triggering signal is necessary if a semiconductor controlled rectifier is to remain in the conductive state for a sustained period of time. Depending upon the use to which the device will be put, this characteristic may be an advantage or a disadvantage. In response to the realization that the "latching" characteristic of SCRs could sometimes be disadvantageous, efforts were made to find a turnoff mechanism independent of the controlled current passing through the SCR.

It was discovered that in some SCRs withdrawing current from the gate will induce a device turnoff. This phenomena is also discussed in the *SCR MANUAL*. Consequently, some devices were adapted to respond efficiently to turnoff signals on the gate. These devices were generally referred to gate turnoff devices.

Consequently, it would seem that a device with desirable characteristics for certain applications could be fabricated by utilizing a pilot SCR in a gate turnoff device. Such a device would have a high current carrying capability, rapid turnon time and gate turnoff capability. However, for reasons to be discussed more fully below it has not heretofore been possible to effectively incorporate a pilot SCR in a gate turnoff device.

It is, therefore, an object of this invention to provide a thyristor comprising a primary SCR capable of carrying high currents and including a pilot SCR for insuring rapid turnon of the primary SCR with low level gate signals and wherein the primary SCR has gate turnoff capabilities.

SUMMARY OF THE INVENTION

This invention is characterized by a thyristor comprising a primary semiconductor controlled rectifier and a pilot semiconductor controlled rectifier. A gate contact receives triggering signals and, in response to the triggering signals, the pilot semiconductor controlled rectifier is rendered conductive. Conduction in the pilot SCR renders the primary SCR conductive. A selective current drain system is coupled to the gate of the primary SCR. Withdrawing current from the selective current drain as described below causes a gate turnoff condition in the primary SCR. Consequently, there has been provided a thyristor comprising a primary SCR that is triggered by a pilot SCR and exhibits gate turnoff capability. Thus, as more fully described below, a thyristor that is capable of conducting high currents and exhibiting a rapid turnon time as a result of energization of the entire emitter periphery and having gate turnoff capability has been provided.

The selective current drain can include a selective coupling such as a diode between the primary SCR and the gate contact. Selective coupling permits the gate contact to be used as the gate turnoff contact, but does not impair the ability to fire the pilot SCR with a low current. This will be more fully described below. A further advantage of using a selective coupling system is that withdrawing current from the gate contact, via a selective coupling, insures that both the pilot and primary SCRs are turned off. If current is not withdrawn from the gate contact there is a danger with certain thyristor designs that the pilot SCR will remain on and inadvertently fire the primary SCR when current withdrawal ceases.

It will be appreciated that if a still faster propagation time is required, interdigitation can be employed. With interdigitation, all of the above mentioned features and advantages will still be realized.

DESCRIPTION OF THE DRAWINGS

These and other features and objects of the present invention will become more apparent upon a perusal of the following description taken in conjunction with the accompanying drawings wherein:

FIG. 1 is a sectional elevation view of a thyristor of the prior art;

FIG. 2 is a plan view of the thyristor depicted in FIG. 1;

FIG. 3 is a plan view of an interdigitated thyristor of the prior art;

FIG. 4 is a plan view of an improved gate turnoff thyristor manufactured in accordance with the subject invention; and FIG. 5 depicts a sectional elevation view of yet another preferred thyristor manufactured in accordance with the subject invention.

DESCRIPTION OF THE PREFERRED EMBODIMENTS

Referring first to FIG. 1 there is shown a sectional elevation view of a portion of a prior art thyristor 21 including a body of semiconductor material 22 containing an anode P region 23, an interior N region 24, a P type gate region 25, an N type emitter region 26 and an N type pilot emitter region 27. Four PN junctions 28, 29, 30 and 31 are defined in the body 22. A metallic anode contact 32 covers the lower surface of the anode region 23. The body of semiconductor material 22 can be thought of as including three horizontally spaced regions. These regions are a gate region 33, a pilot region 34, and a primary region 35.

On the upper surface of the gate region 33 is a metallic gate contact 36. Shorting a portion of the junction 31 on the upper surface of the pilot region 34 is a pilot cathode contact 37 that can provide external circuit connections to the pilot cathode 27 and to a portion of the gate layer 25 near the primary region 35. Substantially coextensive with the emitter layer 26 in the primary region 35 is a metallic emitter contact 38. A resistor is diagramatically shown in the gate region 25 parallel to the pilot cathode emitter 27 to indicate that the gate layer 25, at least near the layer 27, is of a relatively high resistivity for reasons that will become clear below. It will be appreciated that the gate and pilot regions 33 and 34 form a pilot SCR 41 and the primary region 35 forms a primary SCR 42. Pilot SCR terminals comprise the contact 37 and a portion of the contact 32. Primary SCR terminals comprise the contact 38 and a portion of the contact 32.

Operation of the thyristor 21 is as follows. The anode terminal 32 is held at a positive potential with respect to the cathode terminal 38. In that event, the junction 29 is reverse biased and is a blocking junction. In order to initiate conduction, a positive gate signal is applied to the gate contact 36. The gate signal will flow toward the negative potential on the cathode contact 38. Thus, flow of the signal will be through the gate layer 25 laterally toward the cathode layer 26. Some of the current may flow around the pilot cathode layer 27 and through the right hand portion of the auxiliary gate contact 37 and then through the gate layer 25 again to the primary cathode 26. In any event, current will initially flow through the resistance diagramatically illustrated near the pilot cathode layer 27. This current flow will create a voltage drop of the polarity indicated near the resistor symbol. That voltage drop will forward bias a portion of the junction 31 near the gate region 33. Thus, current will flow through a portion of the junction 31 and through the layer 27 to the contact 37. From the right portion of the contact 37, current will reenter the gate layer 25 and continue toward the cathode contact 38. The current flowing through the junction 31 causes the pilot emitter 27 to inject electrons into the gate layer 25 which pass therethrough to the junction 29. Thus, the pilot SCR 41 turns on and a substantial current will then flow therethrough and through the contact 37. The current leaving the contact 37 and flowing through the PN junction 30 to the cathode contact 38 is of a substantially greater magnitude than the gate current and is sufficient to cause electron injection from the left end of the layer 26 to the gate layer 25. The electrons will migrate through the layer 25 to the junction 29. Thus the left portion of the primary SCR 42 turns on and the area of conduction spreads rapidly to be coextensive with the entire primary cathode 26.

Referring now to FIG. 2 there is shown a plan view of the thyristor 21. It will be observed that the contacts 37 and 38 are annular. It is the inner periphery of the contact 37 that is nearest the circular gate contact 36 that initially turns on. Due to the small size of the pilot emitter region 27 it will quickly be conductive over its entirety. A substantial current is then passing through the pilot SCR 41. This current is of a sufficient magnitude that the entire inner periphery of the cathode contact 38 is turned on rather than just isolated points on the periphery. Consequently, it will be appreciated that the thyristor 21 can be activated with a small gate current and yet will rapidly turn on the entire inner periphery of the cathode contact 38 thus improving propagation time. Thus, the utility of the inclusion of the pilot SCR will be appreciated.

Referring now to FIG. 3 there is shown a prior art interdigitated thyristor 21a similar to the thyristor 21.

Portions of the thyristor 21a similar to portions of the thyristor 21 have been given similar reference numerals with the subscript a. The propagation time of the thyristor 21 is too long for certain high frequency applications. In that event, the thyristor 21a can be advantageously utilized. The thyristor 21a is similar to the thyristor 21 except that cathode 26a, the cathode contact 38 and the auxiliary cathode contact 37a are interdigitated as shown. It will be appreciated that this results in a much larger periphery for the contact 38a. Thus, a very large current is required to render the entire periphery of the contact 38a conductive. However, in practice, it is well known that the pilot SCR 41 can supply an adequate current. Consequently, it will be appreciated that the thyristor 21a can be rapidly turned on and propagation time is reduced to a minimum inasmuch as all areas of the cathode layer 26a are very near the periphery thereof.

Certain conventional SCRs without pilot SCRs therein have gate turnoff capability. A gate turnoff device can be turned off by withdrawing a current from the gate contact. Briefly, the turnoff mechanism is as follows. When a current is withdrawn from the gate contact of a conducting SCR the current flowing to the cathode is reduced. Thus, the electron injection from the cathode is reduced. If a sufficient current is withdrawn from the gate, the electron injection from the cathode falls to a low enough level that the PN junction 29 between the interior contactless region and the gate switches to a blocking state.

It has heretofore been considered impossible to provide gate turnoff capability in a thyristor including a pilot SCR for the following reason. Referring again to FIG. 1, it will be recalled that the region of the gate layer 25 adjacent the pilot cathode 27 is of a relatively high resistivity in order to facilitate pilot SCR turnon. It will be appreciated that turnoff current must flow laterally through that region of the gate layer 25 inasmuch as current flowing toward the gate contact 36 through the layer 27 would back bias the left-hand region of the junction 31. Thus, the current withdrawn through the gate flows through the high resistivity region. The high resistivity prevents a sufficient amount of current from flowing to cause turn off of the device. Consequently, while it has long been realized that the provision of gate turnoff capability in a thyristor with a pilot SCR incorporated therein would be beneficial, it has not heretofore been possible.

Referring now to FIG. 4 there is shown one embodiment of the subject improved thyristor 51. It will be appreciated that the device 51 is rendered conductive just as the device 21 was rendered conductive. When it is desired to turn the device 51 off, current is withdrawn from the gate contact 36. It will be appreciated that in the device 51 the contact 37 functions as an auxiliary gate contact 37 and is selectively coupled to the gate contact 36 by a bypass diode 52. Thus current flowing from the vicinity of the cathode region 26 laterally through the gate region 25 flows into the auxiliary gate contact 37, through the diode 52 and out the gate lead 36a. Consequently, the current withdrawn from the gate lead 36a to turn the device 51 off bypasses the high resistivity region by flowing through the diode 52. Therefore, a sufficient amount of current can be withdrawn to insure device turnoff.

Referring now to FIG. 5, there is shown yet another preferred thyristor 61 including an integrally mounted bypass diode 62 on a portion of the auxiliary gate contact 37. A line 63 couples the diode 62 to the gate contact 36. Thus, the thyristor 61 functions precisely as did the thyristor 51.

It must be strongly emphasized that an improved device results from the inclusion of the bypass diode without regard to whether or not interdigitation is employed. Furthermore, conventional commutation turnoff can be used with or without gate turnoff assistance in the subject device.

In view of the foregoing, many modifications and variations of the present invention will be obvious to those skilled in the art. For example, an auxiliary gate contact lead could be brought from the contact 37 and coupled to a signal source to withdraw current therefrom when it is desired to turn the subject thyristor off. Or, the auxiliary gate contact can be coupled to the gate contact 36 by a conventional electromechanical switch or an electronic switch such as a transistor or another thyristor. Furthermore, the bypass diode can be diffused into the body 21. Consequently, the invention can be practiced in other ways than as specifically described.

What I claim as new and desire to secure by Letters Patent of the United States is:

1. A thyristor comprising:
   gate terminal means for receiving triggering signals;
   a pilot semiconductor controlled rectifier comprising pilot contact means, said pilot semiconductor controlled rectifier being for selectively controlling current flow through said pilot contact means in response to triggering signals received by said gate terminal means;
   a primary semiconductor controlled rectifier formed in the same body of semiconductor material as said pilot semiconductor controlled rectifier and comprising primary contact means, said primary semiconductor controlled rectifier being for selectively controlling current flow through said primary contact means in response to current flow through said pilot contact means; and
   auxiliary gate terminal means directly coupled to the gate region of said primary semiconductor controlled rectifier for selectively withdrawing current therefrom so as to render said primary semiconductor controlled rectifier non-conductive.

2. A thyristor according to claim 1 wherein said pilot contact means comprises a pilot cathode contact means coupled to the cathode region of said pilot semiconductor controlled rectifier and to the gate region of said primary semiconductor controlled rectifier, and wherein said auxiliary gate terminal means comprises selective current drain means coupled to said pilot cathode contact means.

3. A thyristor according to claim 2 comprising a gate wherein said selective current drain means comprises selective coupling means for coupling said pilot cathode contact means and said gate terminal means.

4. A thyristor according to claim 3 wherein said selective coupling means comprises bypass diode means for conducting current from said pilot cathode contact means to said gate terminal means.

5. A thyristor according to claim 4 wherein said bypass diode means is an integral part of said thyristor.

6. A thyristor according to claim 4 wherein said pilot cathode contact means is of an interdigitated configuration.

7. A thyristor according to claim 4 wherein the gate region of said pilot semiconductor controlled rectifier is of a relatively high resistivity.

8. A thyristor according to claim 4 wherein said pilot contact means and said primary contact means comprise a common contact.

9. A gate turnoff device comprising a primary semiconductor controlled rectifier and a pilot seiconductor controlled rectifier formed in a single body of semiconductor material said device comprising a gate terminal, and wherein said pilot controlled rectifier is rendered conductive by the receipt of a triggering signal delivered to the gate terminal and said primary controlled rectifier is rendered conductive by this conduction of said pilot controlled rectifier, said primary controlled rectifier comprising a primary gate layer, said device further comprising bypass diode means for conducting turnoff current from said primary gate layer to said gate terminal, said turnoff current bypassing said pilot controlled rectifier.

10. A semiconductor device comprising a first emitter region of first type conductivity, a first base region of opposite type conductivity disposed adjacent said first emitter region, a second base region disposed adjacent said first base region and opposite in conductivity to the first base region, a second emitter region disposed in said second base region and opposite in conductivity to the second base region, a main gate electrode in ohmic contact with a portion of the second base region, an auxiliary emitter region disposed in said second base region between said second emitter region and the portion of the second base region contacted by said main gate electrode, said auxiliary emitter region being opposite in conductivity to the second base region, a main electrode disposed in ohmic contact with said first emitter region, a second main electrode disposed in ohmic contact with said second emitter region, an auxiliary emitter electrode bridging said auxiliary emitter region and said second base region and in ohmic contact with both regions, said auxiliary emitter electrode contacting said second base region on the side of said auxiliary emitter region facing said second emitter region, and a rectifier element electrically connected between said auxiliary emitter electrode and said main gate electrode so that a direction in which a current flows from the auxiliary emitter electrode to the main gate electrode is the forward direction.

11. The device of claim 10 in which the second emitter region is of a ring-shaped configuration, the auxiliary emitter region is disposed within the area enclosed by the ring-shaped configuration and the main gate electrode is surrounded by both the second main electrode and the auxiliary emitter electrode.

12. A three terminal semiconductor switching device having a forward blocking state and a forward conducting state comprising: a thyristor portion and a rectifier portion; said thyristor portion comprising a base region, a cathode emitter region disposed in PN junction forming relationship with the base region, an auxiliary emitter region disposed in PN junction forming relationship with the base region and spaced apart from the cathode emitter region, a cathode electrode disposed in ohmic contact with the cathode emitter region, a gate electrode disposed in ohmic contact with a first portion of the base region separated from the cathode emitter region by the auxiliary emitter region, and an auxiliary emitter electrode disposed in ohmic contact with both the auxiliary emitter region and a second portion of the base region, said second portion lying between the cathode emitter region and the auxiliary emitter region; said rectifier portion comprising a P-type region electrically connected to the auxiliary emitter electrode and an N-type region electrically connected to the gate electrode; whereby said semiconductor switching device may be switched from the forward conducting state to the forward blocking state by applying a voltage potential between the gate electrode and the cathode electrode, said applied voltage at the gate electrode being negative with respect to the cathode electrode voltage.

13. The device of claim 12 in which the cathode emitter region and the auxiliary emitter region are N-type conductivity and the base region is P-type conductivity, another base region of N-type conductivity forms a PN junction with the P-type base region, an anode emitter region of P-type conductivity forms a PN junction with the N-type base region, an anode electrode is disposed in ohmic contact with the anode emitter region, and terminal means for external connections to the device are attached to the anode electrode, the cathode electrode and the gate electrode.

14. The device of claim 12 in which the cathode emitter region is segmented, said segments are separated by portions of the adjacent base region and the auxiliary emitter electrode is disposed in ohmic contact with said portions of the base region.

* * * * *

UNITED STATES PATENT AND TRADEMARK OFFICE
CERTIFICATE OF CORRECTION

PATENT NO. : 4,083,063
DATED : April 4, 1978
INVENTOR(S) : Rosendo U. Yu

It is certified that error appears in the above-identified patent and that said Letters Patent are hereby corrected as shown below:

Claim 1, line 42, delete "directly" and substitute -- operatively --.

Signed and Sealed this

Twenty-eighth Day of November 1978

[SEAL]

Attest:

RUTH C. MASON
Attesting Officer

DONALD W. BANNER
Commissioner of Patents and Trademarks